United States Patent
Hosomi

(10) Patent No.: US 9,177,827 B2
(45) Date of Patent: Nov. 3, 2015

(54) ETCHANT AND METHOD FOR MANUFACTURING SEMICONDUCTOR DEVICE USING SAME

(75) Inventor: Akira Hosomi, Chiba (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 322 days.

(21) Appl. No.: 13/518,714
(22) PCT Filed: Dec. 24, 2010
(86) PCT No.: PCT/JP2010/073367
§ 371 (c)(1), (2), (4) Date: Jun. 22, 2012
(87) PCT Pub. No.: WO2011/078335
PCT Pub. Date: Jun. 30, 2011

(65) Prior Publication Data
US 2012/0270396 A1    Oct. 25, 2012

(30) Foreign Application Priority Data
Dec. 25, 2009   (JP) .................................. 2009-296078

(51) Int. Cl.
*H01L 21/00* (2006.01)
*H01L 21/3213* (2006.01)
(Continued)

(52) U.S. Cl.
CPC ............ *H01L 21/32134* (2013.01); *C23F 1/02* (2013.01); *C23F 1/18* (2013.01);
(Continued)

(58) Field of Classification Search
CPC ... H01L 21/32134; H01L 24/11; H01L 24/03; H01L 2924/01047; H01L 2224/13164; H01L 2924/01004; H01L 2924/014; H01L 2224/13024; H01L 2224/1147; H01L 2224/1311; H01L 2224/05124; C23F 1/44; C23F 1/18; C23F 1/02; C23F 1/26

USPC ................................................ 252/79.1, 79.5
See application file for complete search history.

(56) References Cited

U.S. PATENT DOCUMENTS 8,513,139 B2 * 8/2013 Matsuda et al. .............. 438/745
2004/0118814 A1 6/2004 Kim et al.
(Continued)

FOREIGN PATENT DOCUMENTS

EP      0 845 526 A2   6/1998
JP      11 195665      7/1999
(Continued)

OTHER PUBLICATIONS

U.S. Appl. No. 13/516,524, filed Jun. 15, 2012, Hosomi.
(Continued)

*Primary Examiner* — Laura Menz
(74) *Attorney, Agent, or Firm* — Oblon, McClelland, Maier & Neustadt, L.L.P.

(57) ABSTRACT

Disclosed are an etchant which is used for the manufacture of a semiconductor device using a semiconductor substrate having an electrode and which is capable of selectively etching copper without etching nickel, and a method for manufacturing a semiconductor device using the same. Specifically disclosed are an etchant to be used for the manufacture of a semiconductor device using a semiconductor substrate having an electrode, including hydrogen peroxide, an organic acid, and an organic phosphonic acid, wherein the organic acid is at least one member selected from citric acid and malic acid; a content of hydrogen peroxide is from 0.75 to 12% by mass; a content of the organic acid is from 0.75 to 25% by mass; and a content of the organic phosphonic acid is from 0.0005 to 1% by mass, and a method for manufacturing a semiconductor device using the etchant.

7 Claims, 4 Drawing Sheets

(51) Int. Cl.
*C23F 1/02* (2006.01)
*C23F 1/18* (2006.01)
*C23F 1/26* (2006.01)
*C23F 1/44* (2006.01)
*H01L 23/00* (2006.01)
*H01L 23/525* (2006.01)

(52) U.S. Cl.
CPC .. *C23F 1/26* (2013.01); *C23F 1/44* (2013.01); *H01L 24/03* (2013.01); *H01L 24/11* (2013.01); *H01L 23/525* (2013.01); *H01L 24/05* (2013.01); *H01L 24/13* (2013.01); *H01L 2224/02311* (2013.01); *H01L 2224/0391* (2013.01); *H01L 2224/03462* (2013.01); *H01L 2224/03912* (2013.01); *H01L 2224/0401* (2013.01); *H01L 2224/05124* (2013.01); *H01L 2224/05147* (2013.01); *H01L 2224/05166* (2013.01); *H01L 2224/05548* (2013.01); *H01L 2224/05573* (2013.01); *H01L 2224/05655* (2013.01); *H01L 2224/1147* (2013.01); *H01L 2224/1191* (2013.01); *H01L 2224/11462* (2013.01); *H01L 2224/11849* (2013.01); *H01L 2224/13022* (2013.01); *H01L 2224/13024* (2013.01); *H01L 2224/13082* (2013.01); *H01L 2224/13111* (2013.01); *H01L 2224/13144* (2013.01); *H01L 2224/13147* (2013.01); *H01L 2224/13155* (2013.01); *H01L 2224/13164* (2013.01); *H01L 2924/00013* (2013.01); *H01L 2924/0103* (2013.01); *H01L 2924/01004* (2013.01); *H01L 2924/014* (2013.01); *H01L 2924/01005* (2013.01); *H01L 2924/01006* (2013.01); *H01L 2924/01013* (2013.01); *H01L 2924/01019* (2013.01); *H01L 2924/01029* (2013.01); *H01L 2924/01033* (2013.01); *H01L 2924/01047* (2013.01); *H01L 2924/01075* (2013.01); *H01L 2924/01079* (2013.01); *H01L 2924/01082* (2013.01)

(56) References Cited

U.S. PATENT DOCUMENTS

| | | |
|---|---|---|
| 2006/0292888 A1 | 12/2006 | Park et al. |
| 2008/0286701 A1 | 11/2008 | Rath et al. |

FOREIGN PATENT DOCUMENTS

| | | |
|---|---|---|
| JP | 2003 328159 | 11/2003 |
| JP | 2004 193620 | 7/2004 |
| JP | 2005 105333 | 4/2005 |
| JP | 2005 175128 | 6/2005 |
| JP | 2007 5790 | 1/2007 |
| JP | 2009 505388 | 2/2009 |
| TW | 200936812 A | 9/2009 |
| WO | WO 2009/071351 A1 | 6/2009 |

OTHER PUBLICATIONS

International Search Report Issued Mar. 22, 2011 in PCT/JP10/73367 Filed Dec. 24, 2010.

Extended European Search Report issued Oct. 2, 2014 in Patent Application No. 10839564.1.

Combined Taiwanese Office Action and Search Report issued Nov. 19, 2014 in Patent Application No. 099145796 with English Translation of Category of Cited Documents.

* cited by examiner

ETCHANT AND METHOD FOR MANUFACTURING SEMICONDUCTOR DEVICE USING SAME

TECHNICAL FIELD

The present invention relates to an etchant which is used for the manufacture of a semiconductor device using a semiconductor substrate having an electrode and which is capable of selectively etching copper without etching nickel, and to a method for manufacturing a semiconductor device using the same.

BACKGROUND ART

In recent years, following the requirements for downsizing of electronic appliances, downsizing, high integration and multi-functionalization of semiconductor devices to be used for the electronic appliances are being rapidly advanced, and a number of electrodes which connect a semiconductor device and an electronic appliance to each other tends to increase. As the semiconductor device to be used herein, those which have a wiring redistributed on a semiconductor pad formed of aluminum or the like and provided with a bump electrode are frequently used. In order to simultaneously cope with the downsizing of the semiconductor device and the increase of the electrode number as described above, there are proposed a variety of formation methods of a bump electrode (for example, Patent Documents 1 and 2).

In these formation methods of a bump electrode, there may be the case where an etching step of a wiring to be provided on a semiconductor pad (hereinafter also referred to merely as "electrode") is present, and copper must be etched without etching nickel which is used for the wiring.

More specifically, the formation method of a bump electrode disclosed in Patent Document 1 includes a step of etching, in which on a substrate provided with an electrode which is constituted of an electrically conductive material, a cover film which is opened in the electrode portion is provided; a base electrically conductive film formed by sputtering copper or the like, a photoresist film having an opening extending from the electrode to an area on which a bump electrode is formed, and a copper wiring and a nickel wiring in the opening by electrolytic plating are successively provided; the photoresist film is then removed; and a portion of the base electrically conductive film, which is not covered by the wirings, is etched. In etching copper which forms the base electrically conductive film in the step of etching, in order to ensure higher performances, it is desirable that the nickel wiring formed by electrolytic plating is not etched.

Also, the formation method of a bump electrode disclosed in Patent Document 2 includes an etching step in which on a semiconductor substrate having an aluminum electrode provided therewith, a seed layer is formed of titanium or copper by means of sputtering; a resist in which a portion for forming a bump electrode is opened is formed; a barrier metal layer obtained by laminating plural metals such as titanium, copper, nickel, etc. is formed in the opened area by means of electrolytic plating or the like; solder working as a bump electrode is further formed thereon by means of electrolytic plating; the resist is then removed; and the seed layer is subsequently etched. In etching titanium or copper which forms the seed layer in the step of etching, in order to ensure higher performances, it is desirable that the metal which forms the barrier metal layer, such as nickel, etc., is not etched; and that at the same time, oxidation of the bump electrode composed of solder with an etchant is prevented from occurring, thereby suppressing a reduction of performances of the electrode.

But, in the etching step of Patent Document 1 or Patent Document 2, an etchant which is used in the subject step is not sufficiently reviewed, and in etching the member such as the wiring composed of copper, or the like, even the member composed of nickel is etched, too. Also, it is highly expected that the bump electrode is oxidized, whereby its performances are reduced. As described above, with the progress of downsizing, high integration and multi-functionalization of semiconductor devices, required performances by a customer who uses the semiconductor device are becoming severe. Then, in semiconductor devices which are manufactured by a conventional manufacturing method of semiconductor devices, the tendency that the case where the subject required performances cannot be sufficiently satisfied is caused has become remarkable.

PRIOR ART DOCUMENTS

Patent Documents

Patent Document 1: JP-A-11-195665
Patent Document 2: JP-A-2005-175128

Figure 1:
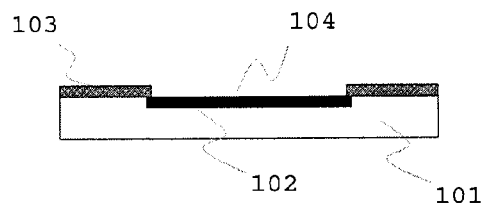
FIG. 1 is a sectional schematic view of a semiconductor device at a step for explaining Manufacturing Method A of a semiconductor device having a bump electrode, showing an electronic circuit containing a semiconductor device formed on a surface of a silicon substrate 101, and an electrode 102 composed of an electrically conductive material pad formed on the surface on which the electronic circuit is formed.

EXPLANATIONS OF REFERENCE NUMERALS 101, 201: Silicon substrate
102, 202: Electrode
103, 203: Insulating film
104, 204: Opening
105, 205: Titanium layer
106, 206: Copper layer
107: Photoresist
108, 208: Opening
109: Nickel layer
110, 213: Solder layer
111: Bump electrode
112: Concave
114, 214: Insulating film
116: Residue of copper layer
207: Photoresist (I)
209: Nickel layer
210: Photoresist (II)
211: Opening
212: Nickel layer
215: Convex solder layer
216: Concave

DISCLOSURE OF THE INVENTION

Problems to be Solved by the Invention

Under such circumstances, the present invention has been made, and its object is to provide an etchant which is used for the manufacture of a semiconductor device using a semiconductor substrate having an electrode and which is capable of selectively etching copper without etching nickel and also preventing a lowering of performances of a bump electrode from occurring and a method for manufacturing a semiconductor device using the same.

Means for Solving the Problems

In order to achieve the foregoing object, the present inventor made extensive and intensive investigations. As a result, it has been found that the foregoing problems can be solved by using an etchant containing hydrogen peroxide, an organic acid, and an organic phosphonic acid in a specified composition, wherein the organic acid is at least one member selected from citric acid and malic acid, each of which is a specified hydroxy acid. That is, the present invention is to provide an etchant which is used for the manufacture of a semiconductor device using a semiconductor substrate having an electrode and which is capable of selectively etching copper without etching nickel and also preventing a lowering of performances of a bump electrode from occurring and a method for manufacturing a semiconductor device using the same.

[1] An etchant to be used for the manufacture of a semiconductor device using a semiconductor substrate having an electrode, comprising hydrogen peroxide, an organic acid, and an organic phosphonic acid, wherein the organic acid is at least one member selected from citric acid and malic acid; a content of hydrogen peroxide is from 0.75 to 12% by mass; a content of the organic acid is from 0.75 to 25% by mass; and a content of the organic phosphonic acid is from 0.0005 to 1% by mass.

[2] The etchant as set forth above in [1], wherein the content of hydrogen peroxide is from 1.5 to 12% by mass, the content of the organic acid is from 1.5 to 20% by mass, and the content of the organic phosphonic acid is from 0.001 to 0.25% by mass.

[3] The etchant as set forth above in [1], wherein the content of hydrogen peroxide is from 1.5 to 5% by mass, the content of the organic acid is from 1.5 to 10% by mass, and the content of the organic phosphonic acid is from 0.01 to 0.15% by mass.

[4] The etchant as set forth above in any one of [1] to [3], wherein the organic phosphonic acid is at least one member selected from diethylenetriamine penta(methylene phosphonic acid), propanediamine tetra(methylene phosphonic acid), and 1-hydroxyethylidene-1,1-diphosphonic acid.

[5] The etchant as set forth above in any one of [1] to [4], wherein the semiconductor device has a bump electrode formed of solder.

[6] The etchant as set forth above in any one of [1] to [5], wherein the semiconductor device has a wiring formed using copper.

[7] A method for manufacturing a semiconductor device, comprising an etching step using the etchant as set forth above in any one of [1] to [6].

[8] The method for manufacturing a semiconductor device as set forth above in [7], wherein the semiconductor device has a bump electrode formed of solder.

[9] The method for manufacturing a semiconductor device as set forth above in [7] or [8], comprising a redistribution layer forming step of forming a wiring on an electrode of the semiconductor substrate having the electrode.

[10] The method for manufacturing a semiconductor device as set forth above in any one of [7] to [9], wherein the semiconductor device has a wiring formed using copper.

Effects of the Invention

According to the present invention, an etchant which is used for a manufacturing step of a semiconductor device using a semiconductor substrate having an electrode and which is capable of selectively etching copper without etching nickel and also preventing a lowering of performances of a bump electrode from occurring and a method for manufacturing a semiconductor device using the same can be provided.

BEST MODES FOR CARRYING OUT THE INVENTION

Etchant

The etchant of the present invention is a liquid which is used in an etching step in a manufacturing step of a semiconductor device using a semiconductor substrate having an electrode and which contains hydrogen peroxide, an organic acid, and an organic phosphonic acid in specified contents, wherein the organic acid is at least one member selected from citric acid and malic acid, each of which is a specified hydroxy acid.

As the organic phosphonic acid, there are preferably exemplified diethylenetriamine penta(methylene phosphonic acid), 3,3'-diaminodipropylamine penta(methylene phosphonic acid), ethylenediamine tetra(methylene phosphonic acid), propanediamine tetra(methylene phosphonic acid), bis(hexamethylene)triamine penta(methylene phosphonic acid), triethylenetetramine hexa(methylene phosphonic acid), tri(2-aminoethyl)amine hexa(methylene phosphonic acid), tri(3-aminopropyl)amine hexa(methylene phosphonic acid), tetraethylenepentamine hepta(methylene phosphonic acid), pentaethylenehexamine octa(methylene phosphonic acid), hexamethylenetetramine octa(methylene phosphonic acid), aminomethyl phosphonic acid, hydroxyethylidene diphosphonic acid, and so on. A part of the phosphonomethyl group in the above compounds may be substituted with a hydrogen atom or other group such as a methyl group, etc. Also, compounds in which the phosphonic acid group of such a phosphonic acid based compound is not a free acid but a salt, for example, an ammonium salt can be similarly used.

Of these, diethylenetriamine penta(methylene phosphonic acid), propanediamine tetra(methylene phosphonic acid), and 1-hydroxyethylidene-1,1-diphosphonic acid are more preferable, and at least one member selected from these compounds is preferable.

In the etchant of the present invention, a content of hydrogen peroxide is required to be from 0.75 to 12% by mass. When the content of hydrogen peroxide is less than 0.75% by mass, an appropriate etching rate cannot be obtained, whereas when it exceeds 12% by mass, the control of hydrogen peroxide becomes difficult, and the concentration of hydrogen peroxide is not stable. Also, from the viewpoints that the control of hydrogen peroxide is easy, the concentration of hydrogen peroxide is stable, and an appropriate etching rate and satisfactory etching performances are obtained, the content of hydrogen peroxide is preferably from 1.5 to 12% by mass, and more preferably from 1.5 to 5% by mass.

A content of the organic acid which is at least one member selected from citric acid and malic acid, each of which is a specified hydroxy acid, is required to be from 0.75 to 25% by mass. When the content of the organic acid is less than 0.75% by mass or more than 25% by mass, an appropriate etching rate and etching performances are not obtained. Also, from the viewpoint of obtaining an appropriate etching rate and etching performances, the content of the organic acid is preferably from 1.5 to 20% by mass, and more preferably from 1.5 to 10% by mass. So far as the content of the organic acid falls within the foregoing range, an appropriate etching rate and satisfactory etching performances are obtained. Here, in the case where the organic acid is a combination of citric acid and malic acid, a total amount of citric acid and malic acid is the content of the organic acid.

Also, a content of the organic phosphonic acid is required to be from 0.0005 to 1% by mass. When the content of the organic phosphonic acid is less than 0.0005% by mass, the oxidation of the bump electrode with the etchant cannot be prevented from occurring, and a reduction of the performances of the electrode cannot be suppressed, whereas when it is larger than 1% by mass, Ni is etched. Also, from the viewpoints of suppressing the oxidation of the bump electrode and suppressing the reduction of the electrode performances, the content of the organic phosphonic acid is preferably from 0.001 to 0.25% by mass, and more preferably from 0.01 to 0.15% by mass. So far as the content of the organic phosphonic acid falls within the foregoing range, this suppressing effect is remarkable especially in the case where the bump electrode is formed of solder.

The etchant of the present invention preferably contains water as other component than hydrogen peroxide, the organic acid, and the organic phosphonic acid. As the water, water from which metal ions, organic impurities, particle grains, and the like have been removed by means of distillation, an ion exchange treatment, a filter treatment, an adsorption treatment of every sort, or the like is preferable. In particular, pure water and ultra-pure water are preferable.

The etchant of the present invention has such a characteristic feature that it selectively etches copper without etching nickel. Accordingly, the etchant of the present invention is suitably used for the etching step in the manufacturing step of a semiconductor device which uses nickel and copper and which is required to selectively etch copper without etching nickel especially among semiconductor devices.

Also, the etchant of the present invention has such a characteristic feature that it prevents the oxidation of the bump electrode from occurring, thereby suppressing a reduction of the performances of the electrode, and this effect is remarkable in the case where the electrode is formed of solder. Accordingly, the etchant of the present invention is preferably used for the etching step in the manufacturing step of a semiconductor device having a bump electrode, and in particular, it is preferably used for the etching step in the manufacturing step of a semiconductor in which the bump electrode is formed of solder.

[Manufacturing Method of Semiconductor Device]

The manufacturing method of a semiconductor device of the present invention includes an etching step using the etchant of the present invention, and it is preferable that the semiconductor device has a bump electrode. Also, from the viewpoint of effectively utilizing the characteristic feature of the etchant of the present invention, which is capable of selectively etching copper without etching nickel, it is preferable that the etching step is characterized in that a member composed of nickel and a member composed of copper are in such a state that the both may be brought into contact with the etchant at the same time; and that the member composed of copper is etched. The manufacturing method of the present invention is hereunder more specifically described.

<<Manufacturing Method A of Semiconductor Device>>

A first embodiment of the manufacturing method of a semiconductor device of the present invention (hereinafter referred to as "Manufacturing Method A") includes a seed layer forming step A1; a photoresist forming step A2; a barrier metal forming step A3; a solder layer forming step A4; an etching step A5 using the etchant of the present invention; and a bump electrode forming step A6 in this order. Manufacturing Method A of the present invention is described in detail by reference to FIGS. 1 to 12.

(Step A1)

Step A1 is a seed layer forming step of providing, on a semiconductor substrate having an electrode provided thereon, an insulating film having an opening from which the electrode is exposed, and further forming a seed layer on the opening and the insulating film. As shown in FIG. 1, the semiconductor substrate having an electrode provided thereon as referred to herein is one in which an electronic circuit containing a semiconductor device which is manufactured by a well-known manufacturing method is, for example, formed on a surface of a silicon substrate 101, and an electrode 102 composed of an electrically conductive material, for example, aluminum, etc., which is called a pad, is formed on the surface on which the electronic circuit is formed. In addition to aluminum, aluminum alloys having titanium or copper added thereto, copper or copper alloys, gold, and the like can also be preferably exemplified as the electrically conductive material.

On the semiconductor 101 having this electrode 102 provided thereon (the surface on which the electrode is formed), an insulating film 103 composed of silicon oxide, etc. is formed, and in the insulating film 103, an opening 104 corresponding to the electrode 102 is formed so as to expose the electrode 102.

Figure 2:
FIG. 2 is a sectional schematic view of a semiconductor device at a step for explaining Manufacturing Method A of a semiconductor device having a bump electrode, showing a titanium layer 105 as a seed layer formed on the opening 104.
Figure 3:
FIG. 3 is a sectional schematic view of a semiconductor device at a step for explaining Manufacturing Method A of a semiconductor device having a bump electrode, showing a titanium layer 105 and a copper layer 106 as seed layers formed on the opening 104.

Subsequently, as shown in FIGS. 2 and 3, a seed layer is formed on the opening 104 and the insulating film 103 usually by means of sputtering. As a metal for forming the seed layer, titanium, copper, and the like are preferably exemplified, and as shown in FIGS. 2 and 3, a layer such as a layer made of such a metal, a titanium layer 105, or a copper layer 106 can be provided in a plural number. Also, from the viewpoints of the adhesion to the electrode 102 and the fabrication control of a semiconductor device, it is preferable to provide the titanium layer 105 on the substrate.

(Step A2)

Figure 4:
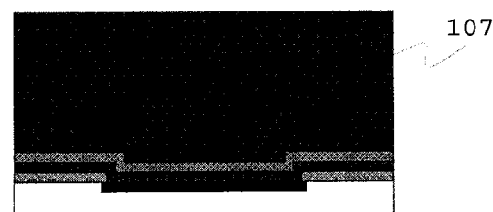
FIG. 4 is a sectional schematic view of a semiconductor device at a step for explaining Manufacturing Method A of a semiconductor device having a bump electrode, showing a photoresist 107 is formed on the cooper layer 106.
Figure 5:
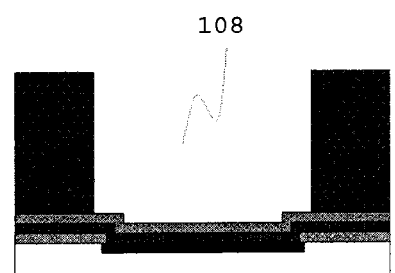
FIG. 5 is a sectional schematic view of a semiconductor device at a step for explaining Manufacturing Method A of a semiconductor device having a bump electrode, showing the photoresist 107 having the opening 108 for forming a bump electrode.

Step A2 is a photoresist forming step of opening a region including an area which is provided on the electrode of the seed layer and an area for forming a bump electrode and forming a photoresist 107 having an opening 108 for exposing the seed layer. First of all, as shown in FIG. 4, the photoresist 107 is formed on the copper layer 106. Subsequently, as shown in FIG. 5, by exposing with light and developing the photoresist, the photoresist 107 having the opening 108 for forming a bump electrode as described later is formed.

(Step A3)

Figure 6:
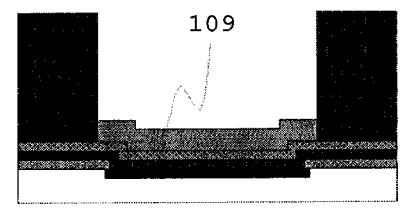
FIG. 6 is a sectional schematic view of a semiconductor device at a step for explaining Manufacturing Method A of a semiconductor device having a bump electrode, showing a nickel layer 109 as part of a barrier metal layer.

Step A3 is a barrier metal forming step of providing a barrier metal layer within the opening 108. In general, in Step A3, as shown in FIG. 6, a nickel layer 109 is provided by a method such as an electrolytic plating treatment, etc., and the nickel layer 109 and the titanium layer 105 and the copper layer 106 provided in Step A1 are collectively called a barrier metal layer. The barrier metal layer is a layer which is provided for preventing diffusion between the electrode 102 and a bump electrode 111 as described later, or the like from occurring, and it is preferable to provide the nickel layer 109 formed of nickel or a nickel alloy.

(Step A4)

Figure 7:
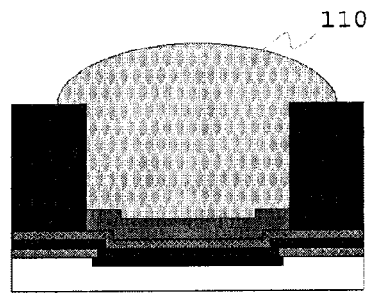
FIG. 7 is a sectional schematic view of a semiconductor device at a step for explaining Manufacturing Method A of a semiconductor device having a bump electrode, showing a solder layer 110 on the nickel layer 109.

As shown in FIG. 7, Step A4 is a step of providing a solder layer 110 on the nickel layer 109. In general, the solder layer 110 is formed by an electrolytic plating treatment using the titanium layer 105 and the copper layer 106 as a seed layer, and at this stage, in general, the solder layer 110 has a mushroom shape such that it protrudes from the opening 108 onto the surface of the photoresist 107. As a material which forms the solder layer 110, there are preferably exemplified, in addition to tin, lead, and an alloy thereof (tin-lead alloy), solder materials such as a tin-silver based alloy, a tin-silver-copper based alloy, a tin-copper based alloy, a tin-zinc based alloy, a tin-bismuth based alloy, a tin-zinc-bismuth based alloy, etc.

(Step A5)

Figure 8:
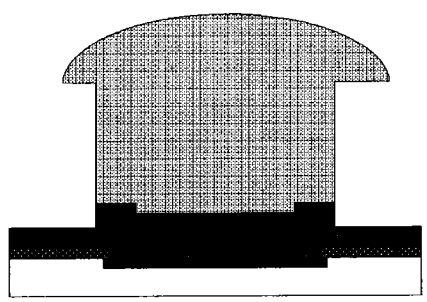
FIG. 8 is a sectional schematic view of a semiconductor device at a step for explaining Manufacturing Method A of a semiconductor device having a bump electrode, showing the device after removing the photoresist.
Figure 9:
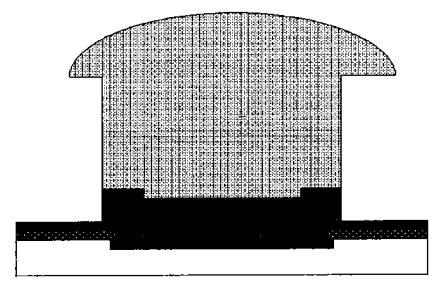
FIG. 9 is a sectional schematic view of a semiconductor device at a step for explaining Manufacturing Method A of a semiconductor device having a bump electrode, showing removal of cooper layer 106.
Figure 10:
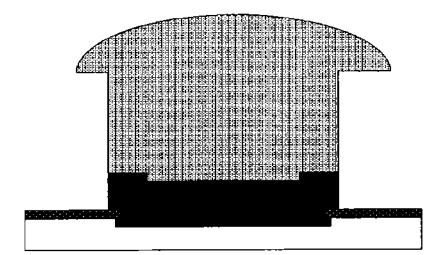
FIG. 10 is a sectional schematic view of a semiconductor device at a step for explaining Manufacturing Method A of a semiconductor device having a bump electrode, showing removal of titanium layer 105 and copper layer 106.

Step A5 is an etching step of after removing the photoresist as shown in FIG. 8, further etching an exposed portion which is not covered by the nickel layer 109 or the solder layer 110 in the seed layer such as the titanium layer 105, the copper layer 106, etc. as shown in FIGS. 9 and 10. By using the etchant of the present invention, it becomes possible to selectively etch copper without etching nickel. Also, in the case where the bump electrode is formed of solder, in particular, the solder contains tin, as in the present manufacturing method, by using the etchant of the present invention, there is obtained such an effect that the performances are not reduced without causing the oxidation of the electrode.

A method of bringing the etchant into contact with an etching object is not particularly limited, and for example, a method of bringing the etchant into contact with the object by a mode such as dropping, spraying, etc., a method of dipping the object in the etchant, and the like can be adopted. In the present invention, a method of bringing the etchant into contact with the object by means of spraying is preferably adopted.

A use temperature of the etchant is preferably a temperature of not higher than 50° C., more preferably from 20 to 50° C., still more preferably from 20 to 40° C., and especially preferably from 25 to 35° C. When the temperature of the etchant is 50° C. or higher, though the etching rate increases, the stability of the liquid is deteriorated, and it is difficult to keep the etching condition constant. By regulating the temperature of the etchant to not higher than 50° C., a change of composition of the etchant is controlled small, and a stable etching rate can be obtained. Also, when the temperature of the etchant is 20° C. or higher, the etching rate does not become excessively slow, and the production efficiency is not remarkably lowered.

Figure 12:
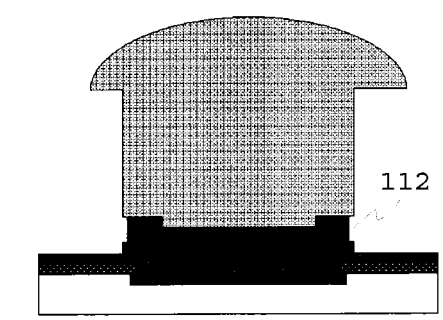
FIG. 12 is a sectional schematic view of a semiconductor device at a step for explaining Manufaturing Method A of a semiconductor device having a bump electrode, showing formation of a concave area 112 caused by the etching of the nickel layer 109.

As shown in FIG. 9, in etching the copper layer 106 in the present etching step, the side face of the nickel layer 112 is exposed to the etchant. In such case, when the etchant of the present invention is used, the formation of a concave 112 caused by the etching of the nickel layer 109 as shown in FIG. 12 does not occur, and it becomes possible to selectively etch only the copper layer 106.

(Step A6)

Figure 11:
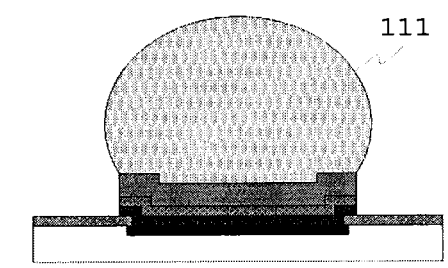
FIG. 11 is a sectional schematic view of a semiconductor device at a step for explaining Manufacturing Method A of a semiconductor device having a bump electrode, showing fusion of the solder layer 110 by a reflow treatment by heating a substrate.

Step A6 is a bump electrode forming step of fusing the solder layer 110 to obtain the bump electrode 111. The fusion of the solder layer 110 may be carried out by a reflow treatment by heating a substrate, and as shown in FIG. 11, the mushroom-shaped solder layer 111 becomes the spherical bump electrode 111 by the reflow treatment.

In this way, a semiconductor device having a bump electrode can be manufactured from a semiconductor substrate having an electrode.

<<Manufacturing Method B of Semiconductor Device>>

A second embodiment of the manufacturing method of a semiconductor device of the present invention (hereinafter referred to as "Manufacturing Method B") includes a seed layer forming step B1; a photoresist (I) forming step B2; a redistribution layer forming step B3; a photoresist (II) forming step B4; a bump electrode forming step B5; and an etching step B6 using the etchant of the present invention in this order. Manufacturing Method B of the present invention is described in detail by reference to FIGS. 13 to 28.

(Step B1)

Step B1 is a seed layer forming step of providing, on a semiconductor substrate having an electrode provided thereon, an insulating film having an opening from which the electrode is exposed, and further forming a seed layer on the opening and the insulating film and is the same as the foregoing Step A1.

Figure 13:
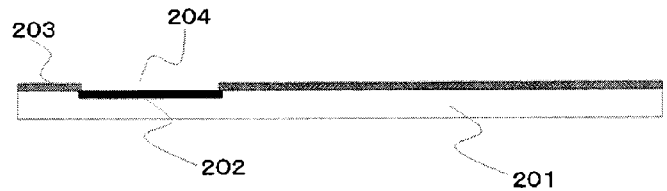
FIG. 13 is a sectional schematic view of a semiconductor device at a step for explaining Manufacturing Method B of a semiconductor device having a bump electrode, showing a semiconductor substrate 201 having an electrode 202 provided thereon and an insulating film 203 having an opening 204 corresponding to the electrode 202 so as to expose the electrode 202.
Figure 14:
FIG. 14 is a sectional schematic view of a semiconductor device at a step for explaining Manufacturing Method B of a semiconductor device having a bump electrode, further having a titanium layer 205.
Figure 15:
FIG. 15 is a sectional schematic view of a semiconductor device at a step for explaining Manufacturing Method B of a semiconductor device having a bump electrode, further having a titanium layer 205 and a copper layer 206.

As shown in FIGS. 13 to 15, on a semiconductor substrate 201 having an electrode 202 provided thereon (the surface on which the electrode is formed), an insulating film 203 having an opening 204 corresponding to the electrode 202 is formed so as to expose the electrode 202, and a titanium layer 205 and a copper layer 206 are formed as a seed layer on the opening 204 and the insulating film 203.

(Step B2)

Figure 16:
FIG. 16 is a sectional schematic view of a semiconductor device at a step for explaining Manufacturing Method B of a semiconductor device having a bump electrode, showing the photoresist (I) 207 formed on the copper layer 206.
Figure 17:
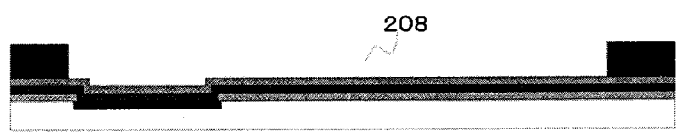
FIG. 17 is a sectional schematic view of a semiconductor device at a step for explaining Manufacturing Method B of a semiconductor device having a bump electrode, showing the photoresist (I) 207 having the opening 208.

Step B2 is a photoresist (I) forming step of opening a region including an area which is provided on the electrode of the seed layer and an area for forming a bump electrode and forming a photoresist (I) 207 having an opening 208 for exposing the seed layer. First of all, as shown in FIG. 16, the photoresist (I) 207 is formed on the copper layer 206. Subsequently, as shown in FIG. 17, by exposing with light and developing the photoresist, the photoresist (I) 207 having the opening 208 for forming a redistribution layer connecting to a region including the area which is provided on the electrode 202 of the seed layer and the area for forming a bump electrode as described later is formed.

(Step B3)

Figure 18:
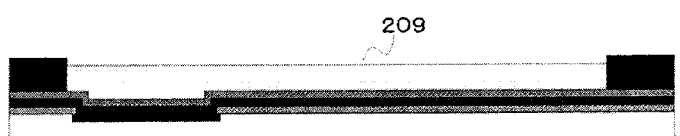
FIG. 18 is a sectional schematic view of a semiconductor device at a step for explaining Manufacturing Method B of a semiconductor device having a bump electrode, showing a further copper layer 209.

Step B3 is a redistribution layer forming step of providing a wiring on the opening 208 to perform redistribution. According to this redistribution layer forming step, a redistribution layer for forming a wiring on the electrode 202 of the semiconductor substrate 201 having the electrode 202 is formed. A material such as copper, nickel, etc. is used for the wiring, and as shown in FIG. 18, it is preferable that the wiring has a copper layer 209 formed of at least copper. Also, the wiring is in general provided by an electrolytic plating treatment of copper or nickel.

(Step B4)

Figure 19:
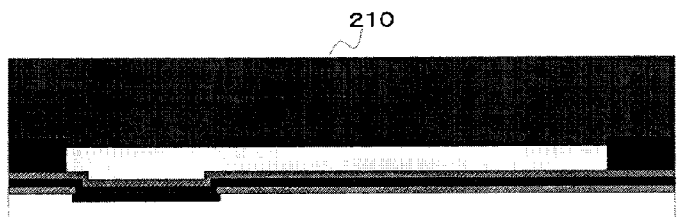
FIG. 19 is a sectional schematic view of a semiconductor device at a step for explaining Manufacturing Method B of a semiconductor device having a bump electrode, showing photoresist (II) forming step of forming a photoresist (II) 210 so as to cover the seed layer and the wiring.
Figure 20:
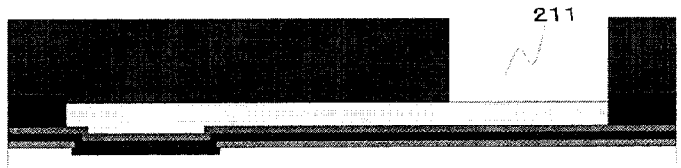
FIG. 20 is a sectional schematic view of a semiconductor device at a step for explaining Manufacturing Method B of a semiconductor device having a bump electrode, showing an opening 211 for forming a bump electrode on the photoresist (II) 210.

As shown in FIGS. 19 and 20, Step B4 is a photoresist (II) forming step of forming a photoresist (II) 210 so as to cover the seed layer and the wiring and further performing exposure with light and development to form an opening 211 for forming a bump electrode on the photoresist (II) 210. This photoresist (II) 210 may be provided in the usual way. Incidentally, the photoresist (II) 210 can also be formed after removing the photoresist (I) in advance.

(Step B5)

Figure 21:
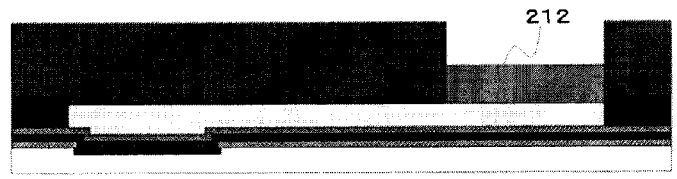
FIG. 21 is a sectional schematic view of a semiconductor device at a step for explaining Manufacturing Method B of a semiconductor device having a bump electrode, showing a nickel layer 212 composed of nickel in the opening 211.
Figure 22:
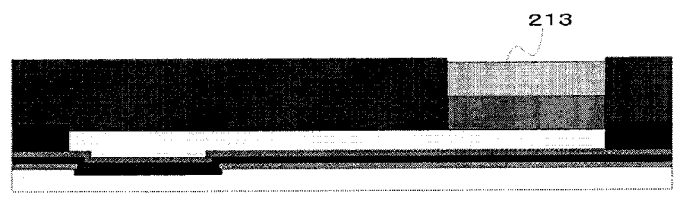
FIG. 22 is a sectional schematic view of a semiconductor device at a step for explaining Manufacturing Method B of a semiconductor device having a bump electrode, showing a solder layer 213 composed of the solder material.

As shown in FIGS. 21 and 22, Step B5 is a bump electrode forming step of providing the opening 211 in an area for forming a bump electrode of the photoresist (II) 210 in such a manner that the copper layer 209 of the redistribution layer is exposed and forming a bump electrode having at least one layer of a nickel layer 212 composed of nickel in the opening 211.

The bump electrode can be formed by using, in addition to the foregoing material for forming the solder layer 110, gold, palladium, nickel, copper, etc. by means of electrolytic plating, and can be formed of a single layer or plural layers. For example, as shown in FIG. 22, after providing the nickel layer 212, a solder layer 213 composed of the solder material is provided, whereby the bump electrode can be formed. In the manufacturing method of the present invention, when the layer for forming a bump electrode is a combination of the nickel layer 212 and a solder layer 213, the performance of not reducing performances without oxidizing the electrode as well as the performance of enabling to selectively etch copper without etching nickel in which the etchant of the present invention has, can be effectively utilized.

(Step B6)

Figure 23:
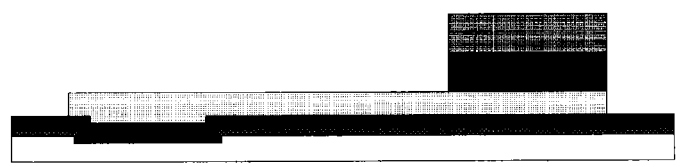
FIG. 23 is a sectional schematic view of a semiconductor device at a step for explaining Manufacturing Method B of a semiconductor device having a bump electrode, showing removal of the photoresist.
Figure 24:
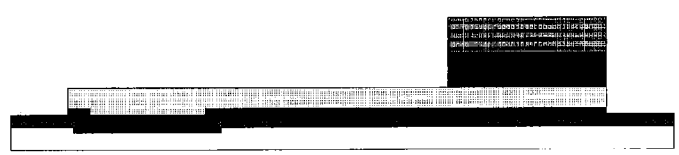
FIG. 24 is a sectional schematic view of a semiconductor device at a step for explaining Manufacturing Method B of a semiconductor device having a bump electrode, showing removal of the copper layer 206.
Figure 25:
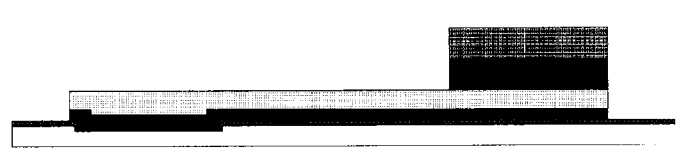
FIG. 25 is a sectional schematic view of a semiconductor device at a step for explaining Manufacturing Method B of a semiconductor device having a bump electrode, showing removal of the copper layer 206 and the titanium layer 205.

Step B6 is an etching step of after removing the photoresist (I) 207 and the photoresist (II) 210 with a resist release solution as shown in FIG. 23, further etching an exposed portion which is not covered by the wiring such as the copper layer 209 in the seed layer such as the titanium layer 205, the copper layer 206, etc. as shown in FIGS. 24 and 25. In the subject etching step, it is required that the etchant of the present invention is used. By using the etchant of the present invention, it becomes possible to selectively etch copper without etching nickel. Also, as in the present manufacturing method, in the case where the bump electrode is formed of solder, in particular, the solder contains tin, by using the etchant of the present invention, there is obtained such an effect that the performances are not reduced without causing the oxidation of the electrode. Various conditions of etching in Step B6 are the same as those in Step A5.

Figure 28:
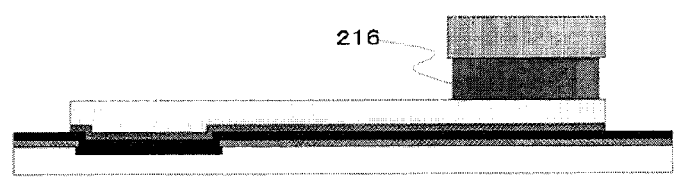
FIG. 28 is a sectional schematic view of a semiconductor device at a step for explaining Manufacturing Method B of a semiconductor device having a bump electrode, showing formation of a concave area 216 caused by the etching of the nickel layer 212.

As shown in FIG. 24, in etching the copper layer 206 in the etching step of Step B6, the nickel layer 212 is exposed to the etchant. In such case, when the etchant of the present invention is used, the formation of a concave 216 caused by the etching of the nickel layer 212 is etched as shown in FIG. 28 does not occur, and it becomes possible to selectively etch only the copper layer 206.

Figure 26:
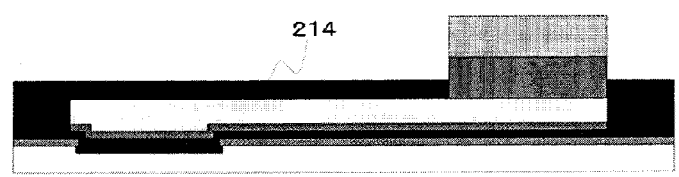
FIG. 26 is a sectional schematic view of a semiconductor device at a step for explaining Manufacturing Method B of a semiconductor device having a bump electrode, showing an insulating film 214.

In Manufacturing Method B of the present invention, as shown in FIG. 26, an insulating film 214 can be further formed in other portion than the area where the bump electrode is formed. For the formation of the insulating film 214, an insulating organic material such as epoxy resins, polyimide resins, etc., or the like is preferably used.

Figure 27:
FIG. 27 is a sectional schematic view of a semiconductor device at a step for explaining Manufacturing Method B of a semiconductor device having a bump electrode, showing a convex solder layer 215.

Furthermore, as shown in FIG. 27, by fusing the solder layer 213 formed in the foregoing Step B5, a convex solder layer 215 can also be formed. The fusion of the solder layer 213 may be carried out by a reflow treatment by heating a substrate.

Among the manufacturing methods of the present invention, according to Manufacturing Method B, the redistribution for forming a wiring on an electrode of a semiconductor substrate having the electrode is achieved, thereby obtaining a semiconductor device having a bump electrode. According to such a manufacturing method, it is possible to use a semiconductor substrate having a narrow pitch such that an electrode-to-electrode pitch is not more than 150 μm, not more than 100 μm, and further not more than 50 μm. Also, a semiconductor device having a narrow pitch such that a bump electrode-to-bump electrode pitch is not more than 500 μm, not more than 250 μm, and further not more than 200 μm can be obtained. Accordingly, the semiconductor device obtained by the manufacturing method of the present invention can thoroughly cope with downsizing, high integration and multi-functionalization in recent years.

EXAMPLES

Next, the present invention is described in more detail with reference to the following Examples, but it should be construed that the present invention is not limited to these Examples at all.

<<Preparation of Processing Liquid>>

An etchant to be used in each of the Examples and Comparative Examples was prepared according to a blending composition (% by mass) shown in Table 1.

<<Evaluation Method>>

Evaluation Item: Evaluation of Appearance (Discoloration) of Plating

With respect to Examples 1 to 38 and Comparative Examples 1 to 20, the state of appearance (discoloration) of each of a tin-lead solder plating and a tin plating before and after a treatment with an etchant was visually evaluated according to the following criteria.

A: The discoloration was not confirmed at all.

B: The discoloration was slightly confirmed, but there is not involved a problem from the standpoint of practical use.

C: The discoloration was remarkable, so that the resultant cannot be used.

Examples 1 to 38 and Comparative Examples 1 to 20

Each of substrates deposited with sputtered copper (thickness of copper film: 5,000 angstrom), a tin-lead solder plating (content ratio: tin/lead=6/4), or a tin plating was dipped in an etchant of each of the Examples and Comparative Examples shown in Table 1 at 30° C. for 2 minutes.

In the substrate after dipping, with respect to the case of sputtered copper, a change in a film thickness before and after dipping was measured using a fluorescent X-ray analyzer ("SEA2110L", manufactured by SII Nano Technology Inc.), from which was then calculated an etching rate (μm/min) of copper. With respect to the cases of the tin-lead solder plating and the tin plating, the appearance, especially the state of discoloration before and after dipping was visually observed and evaluated according to the foregoing evaluation criteria.

Also, a substrate obtained by depositing nickel on a steel material by means of electrolytic plating (thickness of nickel film: 5 μm) was dipped in an etchant of each of the Examples and Comparative Examples at 30° C. for one hour, and a weight before and after dipping was measured, from which was then calculated an etching rate (angstrom/min). These calculated values and evaluation results are shown in Table 1.

TABLE 1

| | | $H_2O_2$ | Organic acid | | Organic phosphonic acid | | Water | Etching rate | | Evaluation of appearance (discoloration) | |
|---|---|---|---|---|---|---|---|---|---|---|---|
| | Liquid No. | Concentration (% by mass) | Kind | Concentration (% by mass) | Kind*[1] | Concentration (% by mass) | Concentration (% by mass) | Sputtered copper (μm/min) | Electrolyzed Ni (angstrom/min) | Sn—Pb solder | Sn plating |
| Example | | | | | | | | | | | |
| 1 | 1 | 10 | Citric acid | 20 | DTPP | 0.005 | 69.99 | 1.0 | <50 | B | A |
| 2 | 2 | 10 | Citric acid | 20 | DTPP | 0.01 | 69.99 | 1.0 | <50 | A | A |
| 3 | 3 | 10 | Citric acid | 5 | DTPP | 0.05 | 79.95 | 1.0 | <50 | A | A |
| 4 | 4 | 8 | Citric acid | 5 | DTPP | 0.05 | 86.95 | 0.8 | <50 | A | A |
| 5 | 5 | 5 | Citric acid | 5 | DTPP | 0.05 | 89.95 | 0.5 | <50 | A | A |
| 6 | 6 | 2 | Citric acid | 5 | DTPP | 0.05 | 92.95 | 0.2 | <50 | A | A |
| 7 | 7 | 1 | Citric acid | 5 | DTPP | 0.05 | 93.95 | 0.1 | <50 | A | A |
| 8 | 8 | 5 | Citric acid | 20 | DTPP | 0.05 | 74.95 | 0.5 | <50 | A | A |
| 9 | 9 | 5 | Citric acid | 15 | DTPP | 0.05 | 79.95 | 0.5 | <50 | A | A |
| 10 | 10 | 5 | Citric acid | 10 | DTPP | 0.05 | 84.95 | 0.5 | <50 | A | A |
| 11 | 11 | 5 | Citric acid | 3 | DTPP | 0.05 | 91.95 | 0.4 | <50 | A | A |
| 12 | 12 | 5 | Citric acid | 2 | DTPP | 0.05 | 92.95 | 0.3 | <50 | A | A |
| 13 | 13 | 5 | Citric acid | 1 | DTPP | 0.05 | 93.95 | 0.2 | <50 | A | A |

TABLE 1-continued

| | Liquid No. | H₂O₂ Concentration (% by mass) | Organic acid Kind | Organic acid Concentration (% by mass) | Organic phosphonic acid Kind*¹ | Organic phosphonic acid Concentration (% by mass) | Water Concentration (% by mass) | Etching rate Sputtered copper (μm/min) | Etching rate Electrolyzed Ni (angstrom/min) | Evaluation of appearance (discoloration) Sn—Pb solder | Evaluation of appearance (discoloration) Sn plating |
|---|---|---|---|---|---|---|---|---|---|---|---|
| 14 | 14 | 5 | Citric acid | 5 | DTPP | 0.001 | 89.95 | 0.5 | <50 | B | A |
| 15 | 15 | 5 | Citric acid | 5 | DTPP | 0.01 | 89.95 | 0.5 | <50 | A | A |
| 16 | 16 | 5 | Citric acid | 5 | DTPP | 0.1 | 89.95 | 0.5 | <50 | A | A |
| 17 | 17 | 5 | Citric acid | 5 | DTPP | 0.2 | 89.95 | 0.5 | <50 | A | A |
| 18 | 18 | 5 | Citric acid | 5 | PDTP | 0.05 | 89.95 | 0.5 | <50 | A | A |
| 19 | 19 | 5 | Citric acid | 5 | HEDP | 0.05 | 89.95 | 0.5 | <50 | A | A |
| 20 | 20 | 10 | Malic acid | 20 | DTPP | 0.001 | 69.99 | 0.9 | <50 | B | A |
| 21 | 21 | 10 | Malic acid | 20 | DTPP | 0.01 | 69.99 | 0.9 | <50 | A | A |
| 22 | 22 | 10 | Malic acid | 5 | DTPP | 0.05 | 79.95 | 0.9 | <50 | A | A |
| 23 | 23 | 8 | Malic acid | 5 | DTPP | 0.05 | 86.95 | 0.8 | <50 | A | A |
| 24 | 24 | 5 | Malic acid | 5 | DTPP | 0.05 | 89.95 | 0.5 | <50 | A | A |
| 25 | 25 | 2 | Malic acid | 5 | DTPP | 0.05 | 92.95 | 0.2 | <50 | A | A |
| 26 | 26 | 1 | Malic acid | 5 | DTPP | 0.05 | 93.95 | 0.1 | <50 | A | A |
| 27 | 27 | 5 | Malic acid | 20 | DTPP | 0.05 | 74.95 | 0.5 | <50 | A | A |
| 28 | 28 | 5 | Malic acid | 15 | DTPP | 0.05 | 79.95 | 0.5 | <50 | A | A |
| 29 | 29 | 5 | Malic acid | 10 | DTPP | 0.05 | 84.95 | 0.5 | <50 | A | A |
| 30 | 30 | 5 | Malic acid | 3 | DTPP | 0.05 | 91.95 | 0.4 | <50 | A | A |
| 31 | 31 | 5 | Malic acid | 2 | DTPP | 0.05 | 92.95 | 0.3 | <50 | A | A |
| 32 | 32 | 5 | Malic acid | 1 | DTPP | 0.05 | 93.95 | 0.2 | <50 | A | A |
| 33 | 33 | 5 | Malic acid | 5 | DTPP | 0.001 | 89.95 | 0.5 | <50 | B | A |
| 34 | 34 | 5 | Malic acid | 5 | DTPP | 0.01 | 89.95 | 0.5 | <50 | A | A |
| 35 | 35 | 5 | Malic acid | 5 | DTPP | 0.1 | 89.95 | 0.5 | <50 | A | A |
| 36 | 36 | 5 | Malic acid | 5 | DTPP | 0.2 | 89.95 | 0.5 | <50 | A | A |
| 37 | 37 | 5 | Malic acid | 5 | PDTP | 0.05 | 89.95 | 0.5 | <50 | A | A |
| 38 | 38 | 5 | Malic acid | 5 | HEDP | 0.05 | 89.95 | 0.5 | <50 | A | A |
| Comparative Example | | | | | | | | | | | |
| 1 | 39 | 2 | Citric acid | 5 | — | 0 | 90 | 0.2 | <50 | C | C |
| 2 | 40 | 0.5 | Citric acid | 5 | DTPP | 0.05 | 94.45 | <0.1 | <50 | A | A |
| 3 | 41 | 5 | Citric acid | 0.5 | DTPP | 0.05 | 84.9 | <0.1 | <50 | A | A |
| 4 | 42 | 2 | Malic acid | 5 | — | 0 | 90 | 0.2 | <50 | C | C |
| 5 | 43 | 0.5 | Malic acid | 5 | DTPP | 0.05 | 94.45 | <0.1 | <50 | A | A |
| 6 | 44 | 5 | Malic acid | 0.5 | DTPP | 0.05 | 84.9 | <0.1 | <50 | A | A |
| 7 | 45 | 5 | Acetic acid | 8 | DTPP | 0.05 | 86.95 | 0.6 | <50 | C | A |
| 8 | 46 | 5 | Glycolic acid | 8 | DTPP | 0.05 | 86.95 | 0.5 | 1,500 | C | C |
| 9 | 47 | 5 | Propionic acid | 8 | DTPP | 0.05 | 86.95 | <0.1 | <50 | C | A |
| 10 | 48 | 5 | Lactic acid | 8 | DTPP | 0.05 | 86.95 | 0.6 | <50 | C | C |
| 11 | 49 | 5 | Butyric acid (butanoic acid) | 8 | DTPP | 0.05 | 86.95 | <0.1 | <50 | A | A |
| 12 | 50 | 5 | Gluconic acid | 8 | DTPP | 0.05 | 86.95 | 0.2 | <50 | C | A |
| 13 | 51 | 5 | Malonic acid | 8 | DTPP | 0.05 | 86.95 | 0.3 | 5,000 | B | A |
| 14 | 52 | 5 | Succinic acid | 8 | DTPP | 0.05 | 86.95 | — | — | — | — |
| 15 | 53 | 5 | Tartaric acid | 8 | DTPP | 0.05 | 86.95 | 0.2 | <50 | B | A |
| 16 | 54 | 5 | Fumaric acid | 8 | DTPP | 0.05 | 86.95 | — | — | — | — |
| 17 | 55 | 5 | Maleic acid | 8 | DTPP | 0.05 | 86.95 | 0.7 | 5,000 | C | A |
| 18 | 56 | 5 | Diglycolic acid | 8 | DTPP | 0.05 | 86.95 | <0.1 | <50 | C | C |
| 19 | 57 | 5 | Glutaric acid | 8 | DTPP | 0.05 | 86.95 | 0.2 | <50 | B | A |
| 20 | 58 | 5 | Itaconic acid | 8 | DTPP | 0.05 | 86.95 | 0.4 | <50 | B | A |

*¹DTPP: Diethylenetriamine penta(methylene phosphonic acid)
PDTP: Propanediamine tetra(methylene phosphonic acid)
HEDP: 1-Hydroxyethylidene-1,1-diphosphonic acid <<Evaluation Method>>

Evaluation Item: Evaluation of Etching Using Semiconductor Substrate

Semiconductor devices were manufactured according to the procedures of A by using an etchant of each of Examples 39 to 44 and Comparative Examples 21 to 27. With respect to the obtained semiconductor devices, the state of a concave of a nickel layer provided by means of electrolytic plating, a residual state of a copper layer provided as a seed layer after etching, and the state of discoloration of a bump electrode were evaluated according to the following criteria, respectively.

(Re: State of Concave of Nickel Layer)
A: The concave of the nickel layer was not confirmed at all.
B: The concave of the nickel layer was slightly confirmed, but there is not involved a problem from the standpoint of practical use.
C: The concave of the nickel layer was remarkable, so that the resultant cannot be used.

(Residual State of Copper Layer)
A: After etching, the residual of the copper layer was not confirmed at all.
B: After etching, the residual of the copper layer was slightly confirmed, there is not involved a problem from the standpoint of practical use.

C: After etching, the residual of the copper layer was remarkable, so that the resultant cannot be used.
(Re: State of Discoloration of Bump Electrode)
 A: The discoloration was not confirmed at all.
 B: The discoloration was slightly confirmed, but there is not involved a problem from the standpoint of practical use.
 C: The discoloration was remarkable, so that the resultant cannot be used.

Examples 39 to 44 and Comparative Examples 21 to 27

Manufacture of Semiconductor Device According to Manufacturing Method A

Semiconductor devices each having an electrode and a bump electrode were fabricated according to the procedures of Manufacturing Method A (FIGS. 1 to 11). Here, tin-lead solder (content ratio: tin/lead=6/4) was used for the formation of the solder layer 110, and in the etching step shown in FIGS. 9 to 12, etching of the copper layer 106 and the titanium layer 105 was successively carried out by using the etchant of each of the Examples and Comparative Examples shown in Table 2. At that time, the etching temperature was 30° C., and the etching time was a time shown in Table 2.

With respect to the semiconductor devices obtained in the respective Examples and Comparative Examples, the results evaluated according to the foregoing evaluation criteria are shown in Table 2.

Example 45 and Comparative Example 28

Semiconductor devices of Example 45 and Comparative Example 28 were fabricated in the same manners as those in Example 39 and Comparative Example 21, respectively, except that the solder layer 110 was provided using tin-silver solder (content of silver: 3% by mass) in place of the tin-lead solder (content ratio: tin/lead=6/4) used in Example 39 and Comparative Example 21.

With respect to the semiconductor devices obtained in the respective Example and Comparative Example, the results evaluated according to the foregoing evaluation items are shown in Table 2.

Examples 46 to 51 and Comparative Examples 29 to 35

Manufacture of Semiconductor Device According to Manufacturing Method B

Semiconductor devices each having an electrode and a bump electrode were fabricated according to the procedures of Manufacturing Method B (FIGS. 13 to 23). Here, tin-lead solder (content ratio: tin/lead=6/4) was used for the formation of the solder layer 110, and in the etching step shown in FIGS. 24 to 25, etching of the copper layer 206 and the titanium layer 205 was successively carried out by using the etchant of each of the Examples and Comparative Examples shown in Table 3. At that time, the etching temperature was 30° C., and the etching time was a time shown in Table 3.

With respect to the semiconductor devices obtained in the respective Examples and Comparative Examples, the results evaluated according to the foregoing evaluation criteria are shown in Table 3.

Example 52 and Comparative Example 36

Semiconductor devices of Example 52 and Comparative Example 36 were fabricated in the same manners as those in Example 46 and Comparative Example 36, respectively, except that the solder layer 210 was provided using tin-silver solder (content of silver: 3% by mass) in place of the tin-lead solder (content ratio: tin/lead=6/4) used in Example 46 and Comparative Example 29.

With respect to the semiconductor devices obtained in the respective Example and Comparative Example, the results evaluated according to the foregoing evaluation items are shown in Table 3.

TABLE 2

| | Liquid No. | Liquid temperature (° C.) | Treatment time (min) | Etching evaluation | | |
| --- | --- | --- | --- | --- | --- | --- |
| | | | | Concave of Ni layer | Residual of copper layer | Discoloration of bump electrode |
| Example | | | | | | |
| 39 | 6 | 30 | 2 | A | A | A |
| 40 | 7 | 30 | 4 | A | A | A |
| 41 | 13 | 30 | 2 | A | A | A |
| 42 | 25 | 30 | 2 | A | A | A |
| 43 | 26 | 30 | 4 | A | A | A |
| 44 | 32 | 30 | 2 | A | A | A |
| 45 | 6 | 30 | 2 | A | A | A |
| Comparative Example | | | | | | |
| 21 | 39 | 30 | 2 | A | A | C*1 |
| 22 | 40 | 30 | 5 | A | C | A |
| 23 | 41 | 30 | 5 | A | C | A |
| 24 | 51 | 30 | 2 | C | A | B |
| 25 | 53 | 30 | 5 | A | C | B |
| 26 | 57 | 30 | 5 | A | C | B |
| 27 | 58 | 30 | 5 | A | C | B |
| 28 | 39 | 30 | 2 | A | A | C |

*1In addition to the discoloration, deformation is also observed.

TABLE 3

| | Liquid No. | Liquid temperature (° C.) | Treatment time (min) | Etching evaluation | | |
|---|---|---|---|---|---|---|
| | | | | Concave of Ni layer | Residual of copper layer | Discoloration of bump electrode |
| Example | | | | | | |
| 46 | 6 | 30 | 2 | A | A | A |
| 47 | 7 | 30 | 4 | A | A | A |
| 48 | 13 | 30 | 2 | A | A | A |
| 49 | 25 | 30 | 2 | A | A | A |
| 50 | 26 | 30 | 4 | A | A | A |
| 51 | 32 | 30 | 2 | A | A | A |
| 52 | 6 | 30 | 2 | A | A | A |
| Comparative Example | | | | | | |
| 29 | 39 | 30 | 2 | A | A | C*1 |
| 30 | 40 | 30 | 5 | A | C | A |
| 31 | 41 | 30 | 5 | A | C | A |
| 32 | 51 | 30 | 2 | C | A | B |
| 33 | 53 | 30 | 5 | A | C | B |
| 34 | 57 | 30 | 5 | A | C | B |
| 35 | 58 | 30 | 5 | A | C | B |
| 36 | 39 | 30 | 2 | A | A | C |

*1In addition to the discoloration, deformation is also observed.

From the results of Examples 1 to 38, it was confirmed that nevertheless the etchant of the present invention has a high etching rate against the sputtered copper as 0.1 μm/min or more, its etching rate against the electrolytic nickel plating is suppressed low as less than 50 angstrom/min. Also, with respect to the tin-lead solder plating and the tin plating, in the case where the content of the organic phosphonic acid is small as less than 0.01% by mass, while discoloration was slightly confirmed, but there is not involved a problem from the standpoint of practical use. Also, in other Examples, discoloration was not confirmed at all.

On the other hand, in Comparative Examples 2 and 5 in which the content of hydrogen peroxide is small as 0.5% by mass, Comparative Example 3 in which the content of citric acid is small as 0.5% by mass, and Comparative Example 6 in which the content of malic acid is small as 0.5% by mass, the etching rate of the sputtered copper was low as less than 0.1 μm/min. Also, in Comparative Examples 9, 11 and 18 each containing other organic acid in place of citric acid or malic acid, the etching rate of the sputtered copper was also low as less than 0.1 μm/min.

In Comparative Examples 1 and 4, each of which is free from the organic phosphonic acid, discoloration was confirmed in all of the tin-lead solder plating and the tin plating. Also, even in the etchant containing 0.05% by mass of the organic phosphonic acid, in Comparative Examples 7 to 10 and 12, each of which is free from citric acid or malic acid as the organic acid, discoloration was confirmed in the tin-lead solder plating or the tin plating.

In Comparative Examples 8, 13 and 17 each containing 5% by mass of hydrogen peroxide and not containing citric acid or malic acid as the organic acid, the etching rate of the electrolytic nickel plating was 500 angstrom/min or more, and selective etching of copper could not be achieved.

In each of Comparative Examples 15, 19 and 20 containing 5% by mass of hydrogen peroxide and containing as tartaric acid, glutaric acid, or itaconic acid as the organic acid, the same etching performances as those in Examples 1 to 38 were obtained. But, in each of Comparative Examples 25 to 27 in which the semiconductor device was fabricated using the etchant used in each of these Comparative Examples, residual of the copper layer after etching was remarkable, so that it was confirmed that the resultant cannot be used for the fabrication of a semiconductor device.

INDUSTRIAL APPLICABILITY

The etchant of the present invention is used for the manufacturing step of a semiconductor device using a semiconductor substrate having an electrode. In an etching step included in the manufacturing step of a semiconductor device, in the case where a layer composed of nickel is exposed to an etchant in etching a layer composed of copper, the etchant of the present invention is especially effective when it is not desired to etch the layer composed of nickel.

The invention claimed is:

1. An etchant consisting essentially of, by mass percent based on a total mass of the etchant:
   from 1.5 to 5% of hydrogen peroxide;
   from 1.5 to 10% of citric acid, malic acid, or a combination thereof;
   from 0.01 to 0.15% of at least one organic phosphonic acid; and
   water.

2. The etchant of claim 1, wherein the organic phosphonic acid consists essentially of:
   at least one selected from the group consisting of diethylenetriamine penta(methylene phosphonic acid), propanediamine tetra(methylene phosphonic acid), and 1-hydroxyethylidene-1,1-diphosphonic acid and
   optionally further organic phosphonic acid.

3. The etchant of claim 1, wherein the organic phosphonic acid consists essentially of:
   diethylenetriamine penta(methylene phosphonic acid) and
   optionally further organic phosphonic acid.

4. The etchant of claim 1, wherein the organic phosphonic acid consists essentially of:
   propanediamine tetra(methylene phosphonic acid) and
   optionally further organic phosphonic acid.

5. The etchant of claim 1, wherein the organic phosphonic acid consists essentially of:
   1-hydroxyethylidene-1,1-diphosphonic acid and
   optionally further organic phosphonic acid.

6. The etchant of claim 1, wherein the citric acid, malic acid, or combination thereof consists of citric acid.

7. The etchant of claim 1, wherein the citric acid, malic acid, or combination thereof consists of malic acid.

* * * * *